United States Patent
Wiles et al.

(10) Patent No.: US 7,796,388 B2
(45) Date of Patent: Sep. 14, 2010

(54) DIRECT COOLED POWER ELECTRONICS SUBSTRATE

(75) Inventors: Randy H. Wiles, Powell, TN (US); Andrew A. Wereszczak, Oak Ridge, TN (US); Curtis W. Ayers, Kingston, TN (US); Kirk T. Lowe, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 12/400,081

(22) Filed: Mar. 9, 2009

(65) Prior Publication Data

US 2009/0231812 A1 Sep. 17, 2009

Related U.S. Application Data

(60) Provisional application No. 61/037,129, filed on Mar. 17, 2008.

(51) Int. Cl.
*H05K 7/20* (2006.01)
*F28D 15/00* (2006.01)

(52) U.S. Cl. .................. 361/699; 361/677; 361/689; 361/702; 361/704; 361/716; 165/104.33; 165/185; 363/141

(58) Field of Classification Search ......... 361/676–678, 361/699, 702, 704, 715–720; 165/80.4, 104.33, 165/185; 363/141
See application file for complete search history.

(56) References Cited

U.S. PATENT DOCUMENTS

| | | | | | |
|---|---|---|---|---|---|
| 3,277,346 | A | * | 10/1966 | McAdam et al. | 361/697 |
| 3,918,084 | A | * | 11/1975 | Schierz | 257/714 |
| 5,586,004 | A | * | 12/1996 | Green et al. | 361/699 |
| 6,501,653 | B1 | * | 12/2002 | Landsgestell et al. | 361/699 |
| 7,059,137 | B2 | * | 6/2006 | Childress | 62/3.3 |
| 7,641,490 | B2 | * | 1/2010 | Korich et al. | 439/196 |

* cited by examiner

*Primary Examiner*—Jayprakash N Gandhi
*Assistant Examiner*—Robert J Hoffberg
(74) *Attorney, Agent, or Firm*—Luedeka, Neely & Graham, P.C.

(57) ABSTRACT

The disclosure describes directly cooling a three-dimensional, direct metallization (DM) layer in a power electronics device. To enable sufficient cooling, coolant flow channels are formed within the ceramic substrate. The direct metallization layer (typically copper) may be bonded to the ceramic substrate, and semiconductor chips (such as IGBT and diodes) may be soldered or sintered onto the direct metallization layer to form a power electronics module. Multiple modules may be attached to cooling headers that provide in-flow and out-flow of coolant through the channels in the ceramic substrate. The modules and cooling header assembly are preferably sized to fit inside the core of a toroidal shaped capacitor.

20 Claims, 6 Drawing Sheets

DIRECT COOLED POWER ELECTRONICS SUBSTRATE

CROSS REFERENCES TO RELATED APPLICATIONS

This patent application claims priority from and is related to U.S. Provisional Patent Application Ser. No. 61/037,129 filed Mar. 17, 2008, entitled DIRECT COOLED POWER ELECTRONICS SUBSTRATE. Patent Application Ser. No. 61/037,129 is incorporated by reference in its entirety herein.

GOVERNMENT RIGHTS

This invention was made with government support under Contract No. DE-AC05-00OR22725 awarded by the U.S. Department of Energy. The government has certain rights in the invention.

FIELD

This invention relates to structures for transferring heat from power electronics devices. More particularly, this invention relates to a system for directly cooling an electrically insulating ceramic substrate to which the power electronics devices are attached.

BACKGROUND

As depicted in FIG. 1, conventional cooling for power electronics is based on heat conduction through multiple layers that are in contact with a heat sink that convects the heat to the ambient. These layers typically consist of a silicon power device or "chip" that is soldered to a conventional Direct Metallization (DM) layer, usually copper. The DM layer is soldered to a copper base plate/heat spreader. The copper base plate/heat spreader is connected via a thermal interface material, such as thermal grease, to an aluminum heat sink. The typical conventional power inverter design is based on a two-dimensional layout where all the heat generating devices are located in a single plane. The heat transfers perpendicularly to this plane to the heat sink.

This conventional serial heat flow path—from chip into solder layer into DM layer into solder layer into copper base plate/heat spreader layer into thermal interface layer and finally into heat sink—introduces significant thermal resistance. As the thermal resistance in the heat flow path increases, so does the size, weight, cost and manufacturing complexity of the heat sink to accommodate it. A more efficient structure for transferring heat from the power electronics chip is needed.

SUMMARY

Typical embodiments described herein provide a solution to the aforementioned problem by eliminating the copper base plate/heat spreader, the thermal grease interface and the aluminum heat sink. While these embodiments render those components expendable, they involve a specific modification of a necessary subcomponent in any power electronic device—an electrically insulating ceramic. Typical embodiments further provide for directly cooling the DM layer by providing coolant flow channels in a ceramic substrate to which the DM layer is directly bonded. The power electronics chips, which may be insulated-gate bipolar transistor (IGBT) devices or diodes, as well as other types of devices such as MOSFETs, silicon carbide devices, etc., may be soldered or sintered onto the DM layer to form a power electronics module. Multiple modules may be packaged in cooling headers that provide in-flow and out-flow of coolant through the channels in the ceramic substrate. The power electronics modules and cooling header assembly are typically sized to fit inside the core of a toroidal shaped capacitor.

Benefits provided by various embodiments of the subject invention include a reduction in the thermal resistance in the heat flow path and a corresponding reduction in the size of the heat sink. This results in a reduction in cost, mass and volume of the heat sink, which is a large portion of the volume of a power inverter. Some embodiments enable the use of 105° C. ethylene glycol/water coolant, such as may be obtained from a vehicle's cooling system to transfer heat from the power electronic devices as opposed to a separate 70° C. loop. In other embodiments, 85° C. transmission oil may be used as the coolant. The application of three-dimensional inverter packaging with direct substrate cooling generally enables an approximately 20% reduction in the volume of the heat sink and a more efficient design. A 10% reduction in power inverter volume may be realized by the elimination of the conventional heat exchanger.

It is anticipated that various embodiments will have a significant beneficial impact on automotive manufacturers by reducing the cost, mass, and volume of power inverters in hybrid electric vehicles and plug-in electric vehicles. The use of 105° C. coolant and the removal of the 70° C. stand-alone cooling loop could result in manufacturer cost savings of approximately $175 per vehicle (in 2008 dollars).

One preferred embodiment provides a power electronics module that is operable in conjunction with a cooling system. The power electronics module of this embodiment includes a substrate having a three-dimensional outer peripheral surface. The module includes a first end portion disposed at a first end of the substrate and a second end portion disposed at a second end of the substrate. The first and second end portions are operable to attach and seal to a coolant input header or a coolant output header of the cooling system. One or more coolant flow channels pass through the interior of the substrate and carry liquid coolant from the cooling system. A plurality of planar facets are disposed on the three-dimensional outer peripheral surface of the substrate and between the first and second end portions. At least one of the planar facets is disposed in a nonparallel relationship with another of the planar facets. A metal layer is disposed on one or more of the planar facets, and one or more power electronic devices are attached to the metal layer.

In some embodiments, the coolant flow channels are disposed adjacent and spaced radially around the outer peripheral surface of the substrate. In some embodiments, the coolant flow channels are helical. In some embodiments, the coolant flow channels have an opening at the first end of the substrate for receiving the liquid coolant from the cooling system and an opening at the second end of the substrate for returning the liquid coolant to the cooling system. In some embodiments, the coolant flow channels have a first opening at the first end of the substrate for receiving the liquid coolant from the cooling system and a second opening at the first end of the substrate for returning the liquid coolant to the cooling system. Some embodiments of the coolant flow channels may include various hole patterns, hole shapes (e.g., oval cross-section, helical axis, etc.), or one or more holes filled with conduction enhancing metal foam inserts.

Another preferred embodiment provides a power electronics assembly that includes a toroidal-shaped capacitor having an interior cavity, a cooling system disposed within the interior cavity of the toroidal-shaped capacitor, and a plurality of power electronics modules as described above disposed within the interior cavity of the toroidal-shaped capacitor. The cooling system includes a first header and a second header, with one end of the substrate of the power electronics modules connected to the first header and the second end of the substrate connected to the second header.

BRIEF DESCRIPTION OF THE DRAWINGS

Further advantages of various embodiments are apparent by reference to the detailed description in conjunction with the figures, wherein elements are not to scale so as to more clearly show the details, wherein like reference numbers indicate like elements throughout the several views, and wherein.

DETAILED DESCRIPTION

Figure 1:
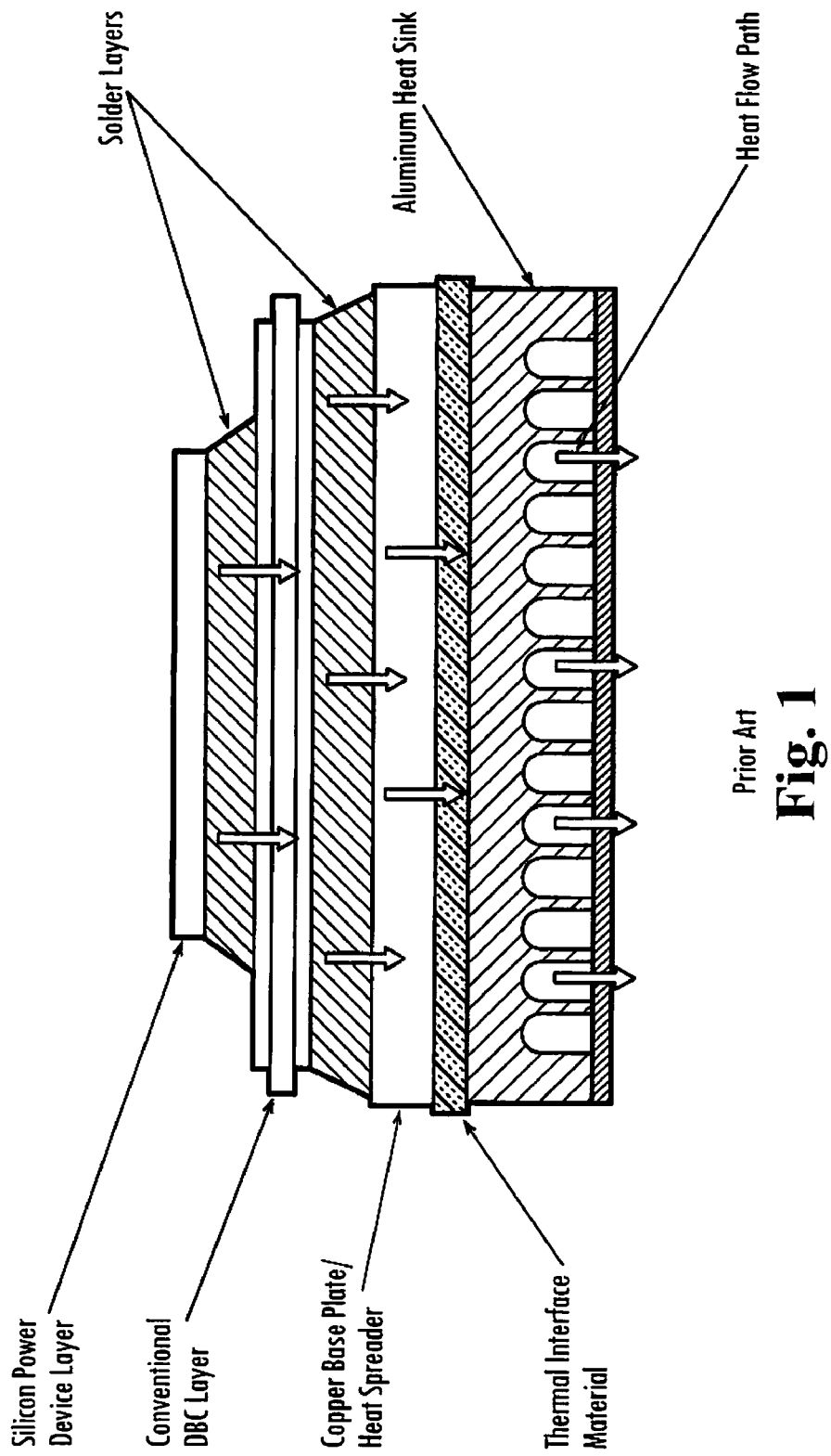
FIG. 1 depicts a prior art structure for transferring heat from a power electronics device.
Figure 2:
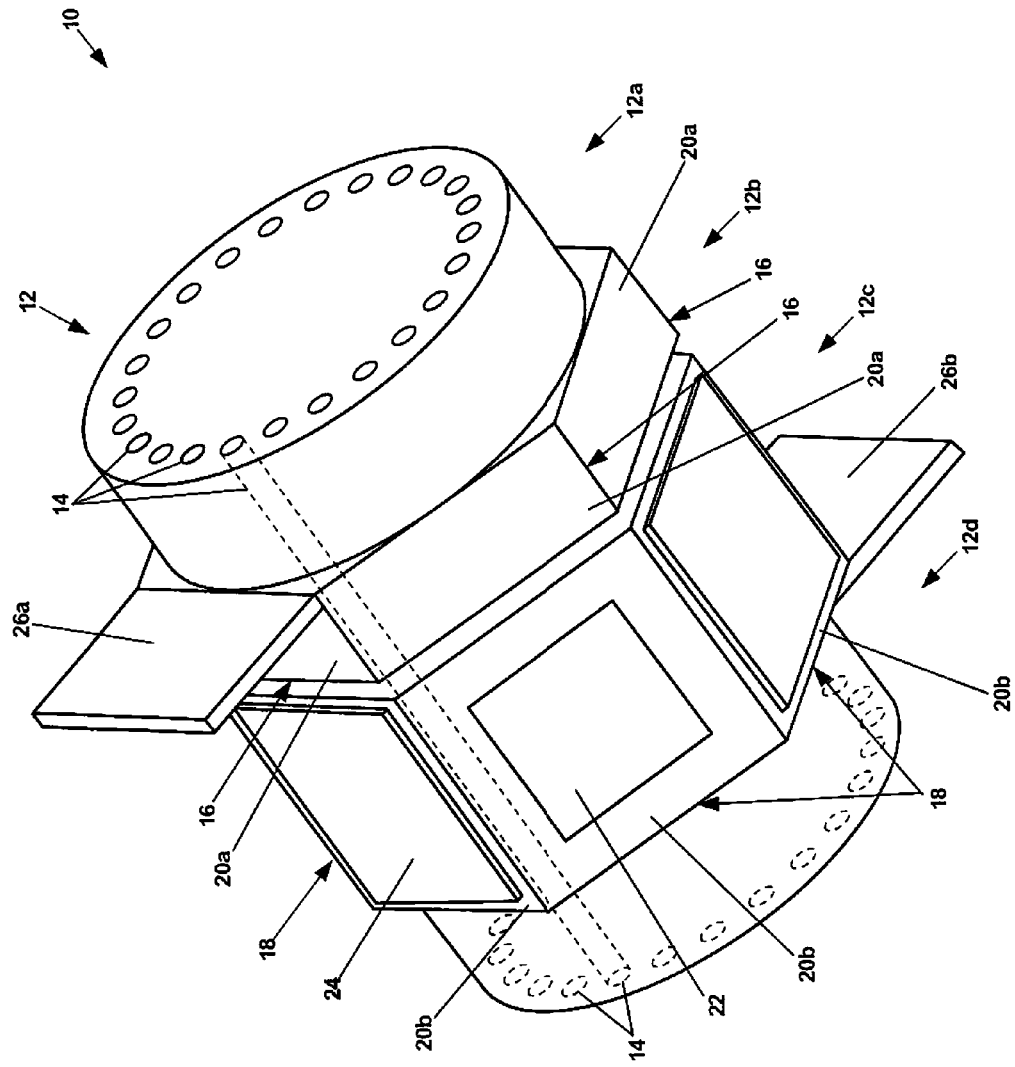
FIG. 2 depicts a perspective view of a three-dimensional philosophy of a liquid-cooled electronics module according to a preferred embodiment.
Figure 4:
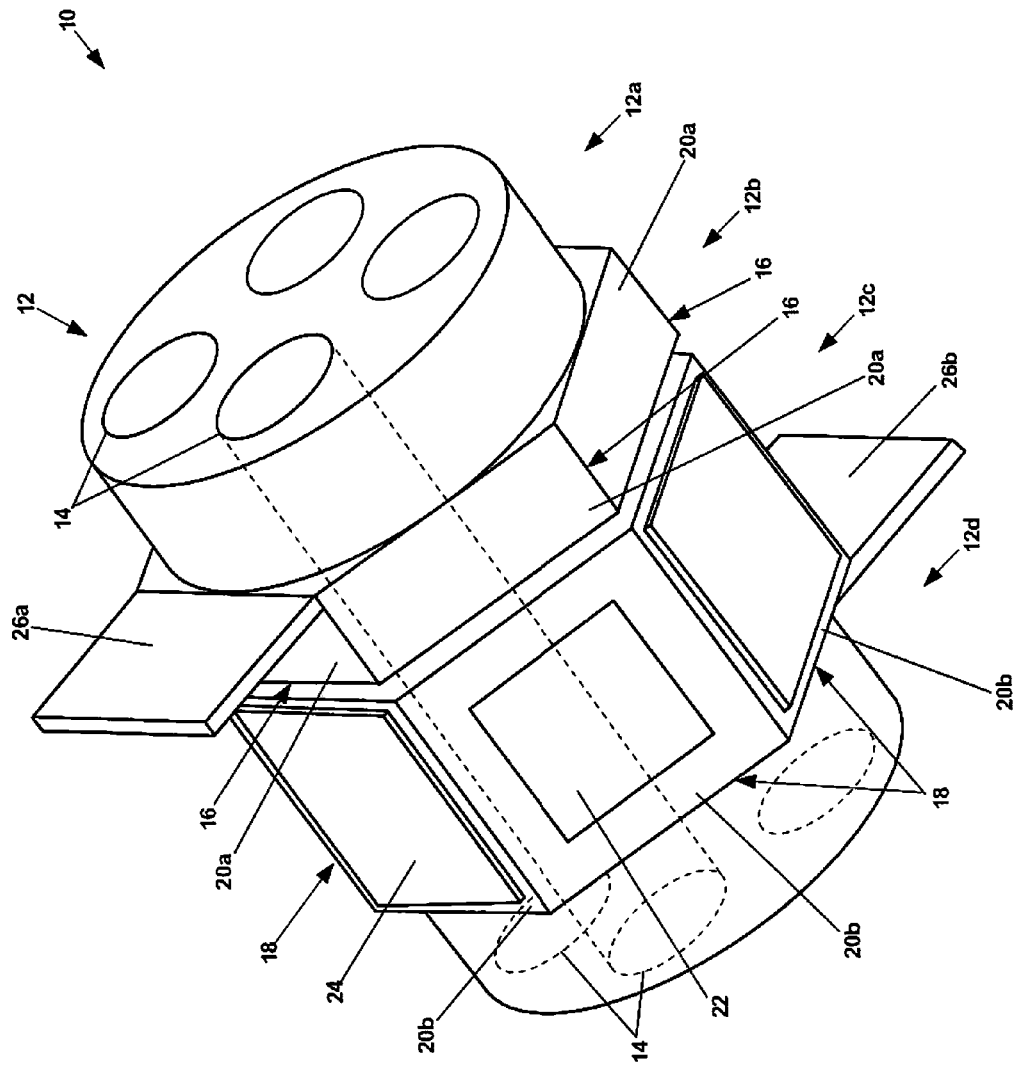
FIG. 4 depicts a perspective view of a three-dimensional philosophy of a liquid-cooled electronics module according to a preferred embodiment.

FIG. 2 and FIG. 4 depict a liquid-cooled power electronics module 10 according to a preferred embodiment. The module 10 includes a three-dimensional, electrically insulating ceramic substrate 12 having a first end portion 12a and a second end portion 12d. A first faceted portion 12b and a second faceted portion 12c are disposed between the first and second end portions 12a and 12d. Preferably, the first and second end portions 12a and 12d are circular in cross-section, and the first and second faceted portions 12b and 12c are polygonal (i.e. triangular, hexagonal, etc.) in cross-section. Although the substrate 12 is formed from ceramic in preferred embodiments, it may also be formed from other high thermal conductivity electrical insulators that have sufficient temperature capability and that are impervious to and environmentally compatible with liquid coolants. Passing through the substrate 12 are coolant-flow channels 14. As discussed in more detail below, when the first and second end portions 12a and 12d of the substrate 12 are connected to coolant in-flow and out-flow headers, liquid coolant may be forced through the channels 14 to transfer heat away from the module 10.

Figure 5:
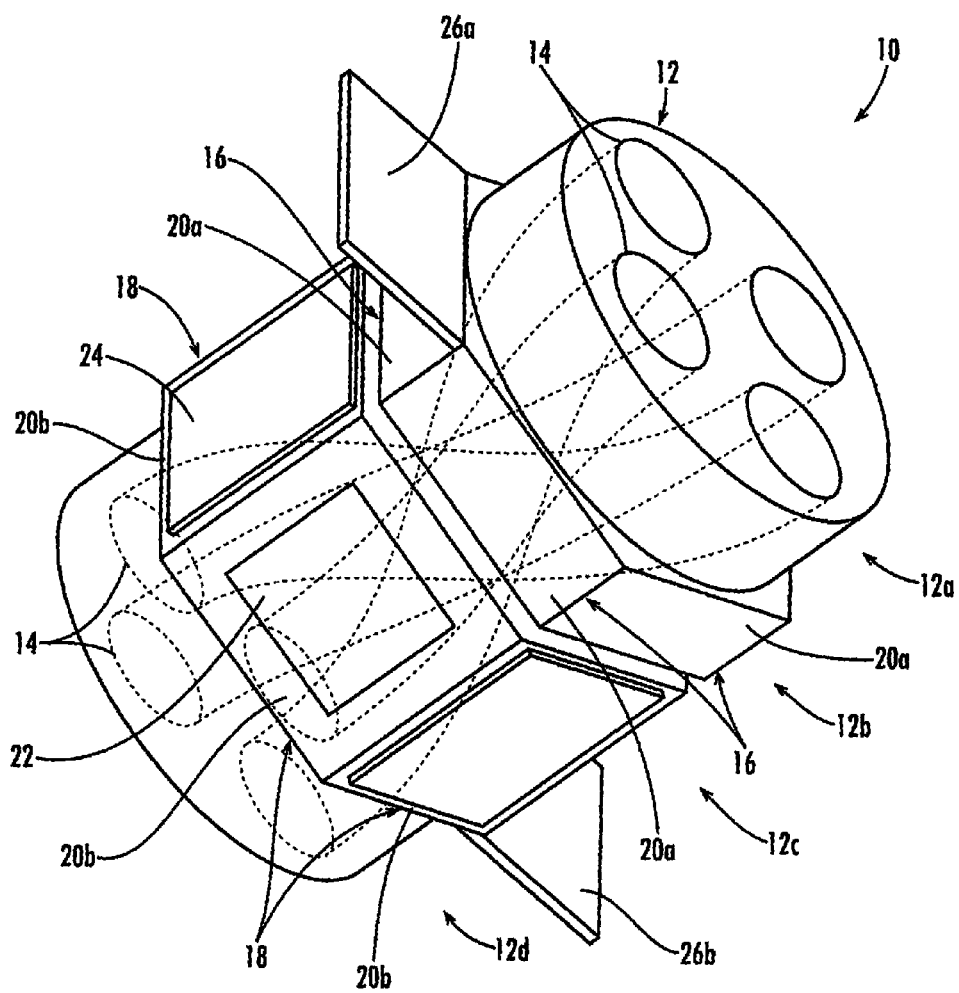
FIG. 5 depicts a perspective view of a three-dimensional philosophy of a liquid-cooled electronics module having helical fluid channels according to a preferred embodiment.

The coolant channels 14 may be substantially straight, as shown in FIG. 2 and FIG. 4, or they may be disposed in a helical or other curved configuration as shown in FIG. 5. In an alternative embodiment, the channels 14 form a loop through the substrate 12, so that the coolant in-flow and out-flow headers may both attach at one end of the substrate 12 rather than at opposing ends. Another embodiment of the coolant channels may include raised, splined, or otherwise enhanced internal surfaces to improve heat transfer to the fluid. Another embodiment consists of coolant channels filled with metallic foam to enhance heat transfer into the coolant.

In the preferred embodiment, the first faceted portion 12b of the substrate 12 has six rectangular faces 16, and the second faceted portion 12c has six rectangular faces 18. It will be appreciated that in alternative embodiments, the first and second faceted portions 12b and 12c of the substrate 12 may have other numbers of faces, such as eight or ten or twelve. For wire bonding purposes, the number of facets in the first portion 12b is preferably equal to the number of facets in the second portion 12c, but this is not required. Thus, the invention is not limited to any particular number of faces on the first or second faceted portions 12b and 12c.

Figure 3:
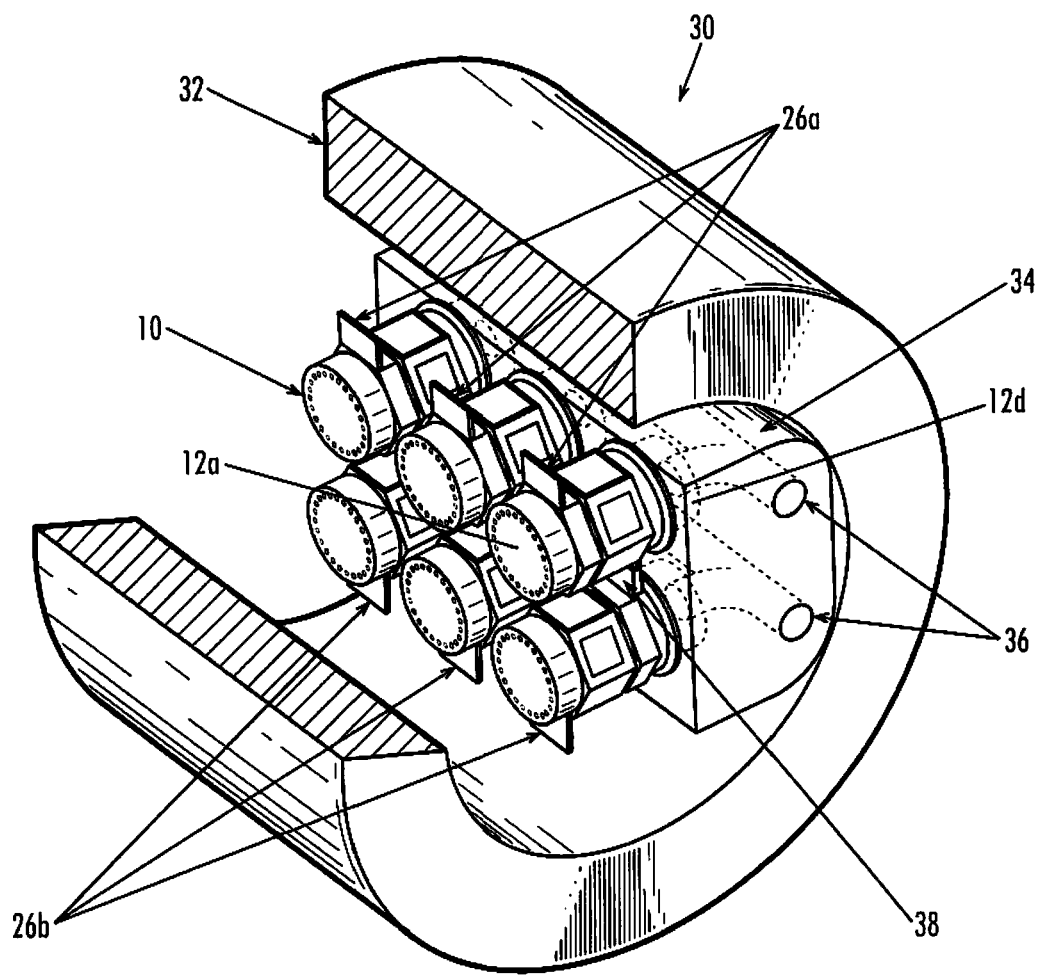
FIG. 3 depicts a perspective cutaway view of multiple liquid-cooled electronics modules attached to a cooling header within the core of a toroidal shaped capacitor according to a preferred embodiment.

In the embodiment of FIG. 2, each of the faces 16 is covered by a Direct Metallization (DM) layer 20a, and each of the faces 18 is covered by a DM layer 20b. The layer 20a is preferably continuous around the faces 16 of the first faceted portion 12b, and the layer 20b is preferably continuous around the faces 18 of the second faceted portion 12c. In portion 12b, the DM layer 20a is electrically connected to either a DC− supply on power connector tab 26a or a phase output connection. In the portion 12c, the DM layer 20b is electrically connected to either a DC+ supply on power connector tab 26b or a phase output connection. Whether the tabs 26a and 26b are connected to a DC supply connection or to a phase output connection depends on whether the specific module is being used for an upper leg or lower leg in the inverter topology (FIG. 3). In alternative embodiments, the DC voltage polarities applied to connector tabs 26a and 26b may be reversed. Power chips, diodes, and input/output tabs will be arranged so as to minimize stray inductance and adverse magnetic effects.

Power electronics chips, which may include but are not limited to insulated-gate bipolar transistor (IGBF) devices 24 or diodes 22, are typically soldered or sintered onto the DM layer 20b of the second faceted portion 12c. During operation of the power electronics chips, heat is transferred from the chips through the DM layer 20b, into the substrate 12 and into the coolant flowing through the channels 14. In some embodiments, electronics devices may also be attached to the DM layer 20a of the first faceted portion 12b.

FIG. 3 depicts a preferred embodiment of a power electronics assembly 30 which includes multiple power electronics modules 10 disposed within a toroidal shaped capacitor 32. For clarity of illustration, a portion of the capacitor 32 is cut away. The coolant channels of the modules 10 are in fluid communication with a first header 34 disposed adjacent an interior portion of the capacitor 32. A second header is disposed adjacent to an opposing interior portion of the capacitor 32. For clarity of illustration, the second header is not shown. However, one skilled in the art will appreciate that the second header may have the same or similar configuration as the first header 34. Coolant is provided to or removed from the first header 34 via coolant ports 36.

As shown in FIG. 3, in the top row of modules 10, the second end portion 12d of each substrate 12 is inserted into the header 34. In the bottom row of modules 10, the first end portion 12a of each substrate 12 is inserted into the header, which is not shown. The modules 10 are positioned so the power connector tabs 26b of the modules 10 in the top row are abutted against the power connector tabs 26a of the modules 10 in the bottom row to form phase out connections 38. In a typical embodiment, the open tabs 26a in FIG. 3 are electrically connected to form the DC− connection, and the open tabs 26b are connected likewise to DC+. The three tabs 38 would be separately and electrically connected to three phase outputs when functioning as a three phase inverter.

In preferred embodiments, the coolant flowing from the first header 34 through the modules 10 is a 50/50 water/ethylene glycol (WEG) mixture.

Figure 6:
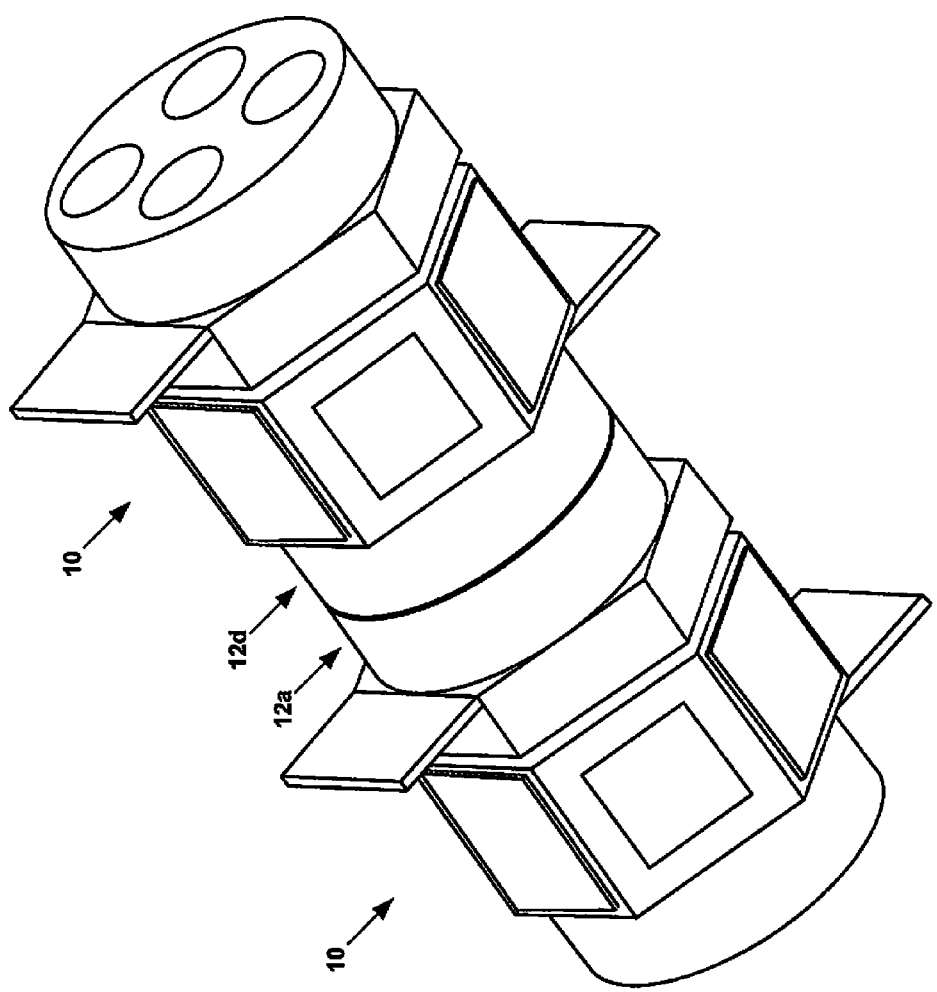
FIG. 6 depicts a perspective view of two liquid-cooled electronics modules connected end-to-end according to a preferred embodiment.

In one embodiment as depicted in FIG. 6, the first end portion 12a of a module 10 is configured to attach and seal to a second end portion 12d of an adjacent module 10. In this embodiment, the modules 10 may be "stacked" end-to-end so that coolant may flow from the coolant channels of one module 10 into the coolant channels of an adjacent module.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A power electronics module operable in conjunction with a cooling system, the power electronics module comprising:
    a substrate with a cross-section which forms a polygon, the substrate having,
        a first end portion disposed at a first end of the substrate, the first end portion operable to attach and seal to a coolant input header of the cooling system;
        a second end portion disposed at a second end of the substrate which is opposite the first end, the second end portion operable to attach and seal to a coolant output header of the cooling system;
        an outer peripheral surface extending between the first and second end portions, the outer peripheral surface comprising a plurality of planar facets that each coincide with a corresponding side of the polygon;
        a substrate interior enclosed by the outer peripheral surface and the first and second end portions; and
        one or more coolant flow channels passing through the substrate interior for carrying liquid coolant from the cooling system, wherein one or more of the coolant flow channels have an inlet opening at the first end portion of the substrate for receiving the liquid coolant from the cooling system and an outlet opening at the second end portion of the substrate for returning the liquid coolant to the cooling system;
    a metal layer disposed directly on at least two adjacent planar facets of the plurality of planar facets; and
    one or more power electronic devices attached to the metal layer on each planar facet of the at least two planar facets.

2. The power electronics module of claim 1 wherein the one or more coolant flow channels comprise a plurality of coolant flow channels disposed adjacent and spaced radially around the outer peripheral surface.

3. The power electronics module of claim 1 wherein one or more of the coolant flow channels are helical.

4. The power electronics module of claim 1 wherein the metal layer comprises a Direct Metallization (DM) layer.

5. The power electronics module of claim 1 wherein the metal layer comprises a copper layer.

6. The power electronics module of claim 1 wherein a first portion of the metal layer is disposed directly on a first facet of the at least two planar facets and is electrically connected to a second portion of the metal layer disposed directly on one or more adjacent facets of the at least two planar facets.

7. The power electronics module of claim 1 further comprising a first power connector tab connected to a first portion of the metal layer disposed directly on a first facet of the plurality of planar facets and a second power connector tab connected to a second portion of the metal layer disposed directly on another of the facets of the plurality of planar facets.

8. The power electronics module of claim 7 wherein the first power connector tab is disposed on an opposite side of the substrate from the second power connector tab.

9. The power electronics module of claim 1 wherein the first end portion of the power electronics assembly is operable to attach and seal to the second end portion of an adjacent power electronics module in a stacked configuration.

10. A power electronics assembly comprising:
    a toroidal-shaped capacitor having an interior cavity;
    a first header of a cooling system disposed within the interior cavity of the toroidal-shaped capacitor;
    a second header of the cooling system disposed within the interior cavity of the toroidal-shaped capacitor; and
    a plurality of power electronics modules disposed within the interior cavity of the toroidal-shaped capacitor and between the first and second headers, each of the power electronics modules comprising:
        a substrate having:
            a three-dimensional outer peripheral surface;
            a first end portion disposed at a first end of the substrate, the first end portion operable to attach and seal to the first header of the cooling system;
            a second end portion disposed at a second end of the substrate which is opposite the first end, the second end portion operable to attach and seal to the second header of the cooling system;
            a substrate interior disposed within the three-dimensional outer peripheral surface and between the first and second end portions;
            one or more coolant flow channels passing through the substrate interior for carrying liquid coolant from the cooling system;
            a plurality of planar facets disposed on the three-dimensional outer peripheral surface and between the first and second end portions of the substrate, wherein at least one of the planar facets is disposed in a nonparallel relationship with another of the planar facets;
        a metal layer disposed on one or more of the planar facets; and
        one or more power electronic devices attached to the metal layer.

11. The power electronics assembly of claim 10 wherein the plurality of power electronics modules are disposed in two adjacent rows, including a first row and a second row,
    wherein each of the power electronics modules includes a first power connector tab connected to a first portion of the metal layer disposed on one of the facets of the plurality of planar facets and a second power connector tab connected to a second portion of the metal layer disposed on another of the facets of the plurality of planar facets, and
    wherein the first power connector tabs of the power electronics modules in the first row are electrically connected to the second power connector tabs of the power electronics modules in the second row.

12. The power electronics assembly of claim 11 wherein the first power connector tab of each power electronics module is disposed on an opposite side of the substrate from the second power connector tab.

13. A power electronics module operable in conjunction with a cooling system, the power electronics module comprising:
    a substrate with a cross-section which forms a polygon, the substrate having,
        a first end portion disposed at a first end of the substrate, the first end portion operable to attach and seal to a coolant input header of the cooling system;
        a second end portion disposed at a second end of the substrate which is opposite the first end, the second end portion operable to attach and seal to a coolant output header of the cooling system;
        an outer peripheral surface extending between the first and second end portions, the outer peripheral surface comprising a plurality of planar facets that each coincide with a corresponding side of the polygon;
        a substrate interior enclosed by the outer peripheral surface and the first and second end portions; and
        one or more coolant flow channels passing through the substrate interior for carrying liquid coolant from the cooling system, wherein one or more of the coolant flow channels have an inlet opening at the first end portion of the substrate for receiving the liquid coolant from the cooling system and an outlet opening at the second end portion of the substrate for returning the liquid coolant to the cooling system;
    a metal layer disposed directly on and continuously wrapped around at least two adjacent planar facets of the plurality of planar facets; and
    one or more power electronic devices attached to the metal layer on each planar facet of the at least two planar facets.

14. The power electronics module of claim 13 wherein the one or more coolant flow channels comprise a plurality of coolant flow channels disposed adjacent and spaced radially around the outer peripheral surface.

15. The power electronics module of claim 13 wherein one or more of the coolant flow channels are helical.

16. The power electronics module of claim 13 wherein the metal layer comprises a Direct Metallization (DM) layer.

17. The power electronics module of claim 13 wherein the metal layer comprises a copper layer.

18. The power electronics module of claim 13 wherein a first portion of the metal layer is disposed directly on a first facet of the at least two planar facets and is electrically connected to a second portion of the metal layer disposed directly on one or more adjacent facets of the at least two planar facets.

19. The power electronics module of claim 13 further comprising a first power connector tab connected to a first portion of the metal layer disposed directly on a first facet of the plurality of planar facets and a second power connector tab connected to a second portion of the metal layer disposed directly on another of the facets of the plurality of planar facets, wherein the first power connector tab is disposed on an opposite side of the substrate from the second power connector tab.

20. The power electronics module of claim 13 wherein the first end portion of the power electronics assembly is operable to attach and seal to the second end portion of an adjacent power electronics module in a stacked configuration.

* * * * *